United States Patent [19]

Takayama

[11] Patent Number: 4,677,693
[45] Date of Patent: Jun. 30, 1987

[54] FREQUENCY CONVERSION CIRCUIT

[75] Inventor: Akira Takayama, Soma, Japan

[73] Assignee: Alps Electric Co., Ltd., Japan

[21] Appl. No.: 824,426

[22] Filed: Jan. 31, 1986

[30] Foreign Application Priority Data

Jan. 31, 1985 [JP] Japan ................................ 60-12348

[51] Int. Cl.$^4$ ............................................. H04B 1/26
[52] U.S. Cl. ................................. 455/327; 455/325; 455/330; 333/204; 333/205
[58] Field of Search ............... 455/325, 327, 328, 330, 455/331, 333; 333/202, 204, 205

[56] References Cited

U.S. PATENT DOCUMENTS

| | | | |
|---|---|---|---|
| 3,823,380 | 7/1974 | Young ................................ | 455/325 |
| 4,249,263 | 2/1981 | Shinkawa et al. .................. | 455/330 |
| 4,455,540 | 6/1984 | Herriot et al. ..................... | 333/202 |
| 4,578,656 | 3/1986 | Lacour et al. ..................... | 333/204 |

FOREIGN PATENT DOCUMENTS

| | | | |
|---|---|---|---|
| 58-17711 | 2/1983 | Japan ................................ | 455/327 |
| 0134515 | 8/1983 | Japan ................................ | 455/327 |
| 2104750 | 3/1983 | United Kingdom ............... | 455/327 |

*Primary Examiner*—Jin F. Ng
*Assistant Examiner*—Elissa Seidenglanz
*Attorney, Agent, or Firm*—Guy W. Shoup

[57] ABSTRACT

A band pass filter and frequency converter in a frequency conversion circuit are arranged such that a strip line constituting a part of the frequency converter and having a ¼ wavelength relative to that of a local oscillation signal, is disposed adjacently in parallel to one of the opposite sides of a U-shaped line of the band pass filter to thereby form inductive coupling through which the frequency converter and the band pass filter are connected to each other at a high impedance open end of the above-mentioned strip line, so that the inductive coupling is made to be sufficiently strong. Accordingly, it is possible to produce a sufficiently large intermediate-frequency signal.

2 Claims, 3 Drawing Figures

FREQUENCY CONVERSION CIRCUIT

BACKGROUND OF THE INVENTION

1. Field of the Invention

The present invention relates to an improvement of a microwave-band frequency conversion circuit constituted by strip lines.

2. Description of the Prior Art

FIG. 2 is a circuit diagram showing an example of a conventional microwave-band frequency conversion circuit. In FIG. 2, an input terminal 1 is connected to a band pass filter 3 through a line 2, and an output of the band pass filter 3 is connected to a balanced-type frequency converter 7 through a series connection of a line 4, a coupling capacitor 5, and a line 6. The lines 2, 4, and 6 as well as lines constituting the band pas filter 3 and the balanced frequency converter 7 are constituted by strip lines which are formed on a dielectric substrate by printing, photo-etching, or the like. The band pass filter 3 is constituted by a plurality of U-shaped lines, for example, three U-shaped lines, as shown in FIG. 2, each having a wavelength substantially one-half of that of an input signal, the band pass filter being arranged such that the respective opening portions of the U-shaped lines are alternately reversed in orientation and that respective opposite sides of the U-shaped lines are disposed in parallel to each other. In the balanced frequency converter 7, respective lines 9 and 10 each having a wavelength substantially one-quarter of that of a local oscillation signal are connected to the opposite ends 8a and 8b of a U-shaped line 8 having a wavelength substantially one-half of that of the inoput signal and extended in the directions of the respective extensions of the opposite sides of the U-shaped line 8. Further, two mixing diodes 11 and 12 are disposed in series to each other between the opposite ends 8a and 8b of the U-shaped line 8, the junction between the diodes 11 and 12 being connected to one end of each of the capacitor 13 and a coil 14. The respective other ends of the capacitor 13 and the coil 14 are connected to a local oscillation signal input terminal 15 and an intermediate-frequency signal output terminal 16, respectively.

In the thus arranged circuit, among input signals supplied to the input terminal 1, only the input signal having a frequency in a specific frequency band is selected owing to the resonance of the lines constituting the band pass filter 3, and supplied to the balanced frequency converter 7 through the line 4, the coupling capacitor 5, and the line 6. The input signal supplied to the one end 8a of the U-shaped line 8 of the balanced frequency converter 7 is produced from the other end 8b of the same with a phase inverted by the U-shaped line 8. Accordingly, a potential difference is generated between the opposite ends 8a and 8b of the U-shaped line 8 in accordance with the input signal, and supplied to the diodes 11 and 12. A local oscillation signal externally applied to the local oscillation signal input terminal 15, on the other hand, is supplied to the diodes 11 and 12 through the capacitor 13. The lines 9 and 10 are made to resonate relative to the local oscillation signal so as to cause the local oscillation signal to easily flow into the diodes 11 and 12. Then, the local oscillation signal and the input signal are mixed with each other by the diodes 11 and 12 so as to form an intermediate-frequency signal. The capacitor 13 is selected to have impedance which is low with respect to the local oscillation signal while high with respect to the intermediate-frequency signal so that the intermediate-frequency signal is prevented from flowing into the local oscillation signal input terminal 15. The coil 14 is, on the contrary, selected to have impedance which is high with respect to the input signal and the local oscillation signal and while low with respect to the intermediate-frequency signal so that the input signal and the local oscillation signal are prevented from flowing into the intermediate-frequency signal output terminal 16. Accordingly, only the intermediate-frequency signal is produced from the intermediate-frequency signal output terminal 16.

FIG. 3 is a circuit diagram showing a frequency conversion circuit which has been conventionally proposed for the purpose of further miniaturizing the conventional frequency conversion circuit having such a structure as shown in FIG. 2. In FIG. 3, circuit components corresponding to those in FIG. 2 are correspondingly referenced and repeated explanation is omitted.

In FIG. 3, the frequency conversion circuit is different from that shown in FIG. 2 in that one of the opposite sides of a U-shaped line of a band pass filter 3 is disposed adjacently to and in parallel with one of two opposite sides of a U-shaped line 8 of a balanced frequency converter 7 so as to provide inductive coupling between the band pass filter 3 and the balanced frequency converter 7. The U-shaped lines of the band pass filter 3 disposed adjacently to the U-shaped line 8 of the balanced frequency converter 7 are arranged such that the respective openings of U-shaped are alternatively reversed in orientation.

In the foregoing conventional frequency conversion circuit having the structure as shown in FIG. 2, it is necessary to connect the band pass filter 3 to the balanced frequency converter 7 through the line 4, the coupling capacitor 5, and the line 6 to sufficiently separate the band pass filter 3 from the balanced frequency converter 7 so as not to provide inductive coupling therebetween. This is because, since the band pass filter 3 is connected to the balanced frequency converter 7 through the lines 4 and 3, it is necessary to provide the coupling capacitor 5 for the purpose of DC blocking, so that the phase of an input signal transmitted from the band pass filter 3 to the balanced frequency converter 7 through the line 4, the coupling capacitor 5, and the line 6 is different from that of the input signal transmitted from the former to the latter through inductive coupling and it is necessary to prevent the input signal from being transmitted through inductive coupling. Accordingly, there has been such a problem that it was required to prepare a larger space for providing the whole arrangement of the frequency conversion circuit because the distance between the pass filter 3 and the balanced frequency converter 7 had to be selected to be not smaller than five times as long as the conductor width of the line. Accordingly, the conventional frequency conversion circuit shown in FIG. 2 is unsuitable for the purpose of miniaturization of the device in which the frequency conversion circuit is incorporated.

In the conventional frequency conversion circuit having a structure as shown in FIG. 3, on the other hand, there has been such an advantage that not so large space is required for providing the band pass filter 3 and the balanced frequency converter 7 because the former is connected to the latter through inductive coupling. However, since the diodes 11 and 12 are connected between the opposite ends 8a and 8b of the U-shaped line 8 of the balanced frequency converter 7, the impedance between the opposite ends 8a and 8b is low and acts as a load for an induced voltage induced in the U-shaped line 8 by an electromagnetic wave radiated from the band pass filter 3, so that the inductive coupling between the band pass filter 3 and the balanced frequency converter 7 is weakened. Therefore, there has been such a problem that the intermediate-frequency signal to be produced was small because a sufficiently large input signal could not be obtained in the balanced frequency converter 7.

SUMMARY OF THE INVENTION

An object of the present invention is to solve the problems in the prior art frequency conversion circuit as described above.

Another object of the present invention is to provide a frequency conversion circuit in which not only a smaller space is sufficient for providing the frequency conversion circuit but also a sufficiently large output of an intermediate-frequency signal can be obtained.

In order to attain the objects as described above, according to the present invention, the frequency conversion circuit for converting an input signal into an intermediate-frequency signal comprises: a first input terminal for receiving an externally applied input signal; a band pass filter connected at its one end to the first input terminal; a second input terminal for receiving an externally applied local oscillation signal; an output terminal for externally sending out an intermediate-frequency output signal; the band filter including at least a first one U-shaped line of a wavelength substantially one-half of a wavelength of the input signal; a frequency converter including a second U-shaped line of a wavelength substantially one-half of the wavelength of said input signal and with its opposite sides disposed substantially parallely with opposite sides of the first U-shaped line, a pair of strip lines connected to and aligned with the opposite sides of the second U-shaped line respectively, each strip line being of a wavelength substantially one-quarter of a wavelength of the local oscillation signal, a pair of diodes connected in series with each other between the respective ends of the opposite sides of the second U-shaped line; the second input terminal and the output terminal being coupled to a junction point between the pair of diodes; the band pass filter being coupled at its other end with the frequency converter through an inductive coupling means formed at a position at which the highest impedance appears in the strip lines.

Preferably, the inductive coupling means is formed such that one of the opposite sides of the first U-shaped line is disposed adjacently in parallel to one of the pair of strip lines so that the band pass filter is coupled with the frequency converter at an open end portion of the above-mentioned strip lines.

Since the frequency converter and the band pass filter are connected with each other through inductive coupling at a high-impendance open end portion of the strip lines each of a ¼ wavelength relative to the wavelength of the local oscillation signal, it is possible to obtain satisfactorily strong inductive coupling therebetween. Therefore, not only it is possible to generate a sufficiently large intermediate-frequency signal but also a smaller space may be sufficient for providing the frequency conversion circuit, so that it is suitable to realize the miniaturization of the device in which the frequency conversion circuit is incorporated. Further, no coupling capacitor is required so that the frequency conversion circuit can be reduced in cost correspondingly.

The above and other objects, features, and advantages of the present invention will be more apparent from the following description with reference to the accompanying drawings:

DETAILED DESCRIPTION OF THE PREFERRED EMBODIMENT

Figure 1:
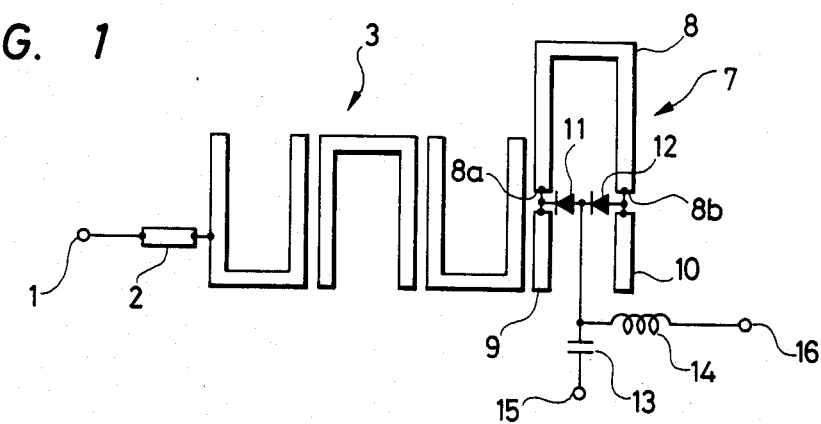
FIG. 1 is a circuit diagram showing an embodiment of the frequency conversion circuit according to the present invention.
Figure 2:
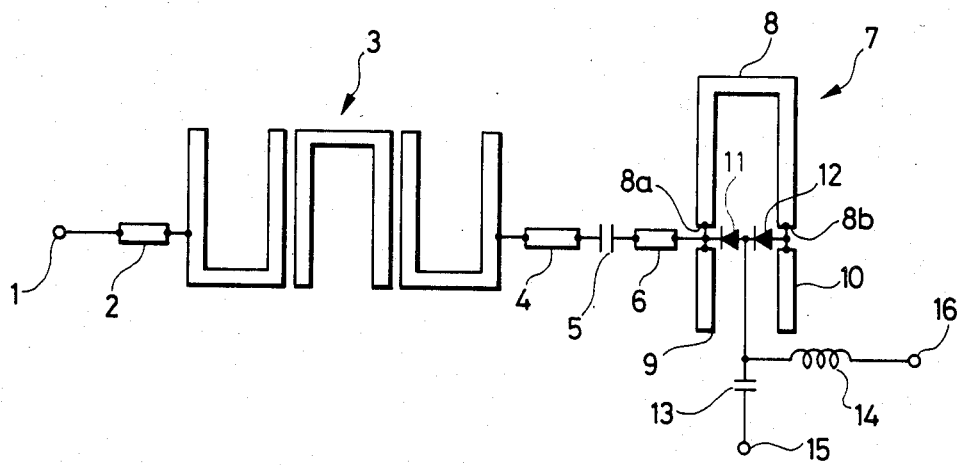
FIG. 2 is a circuit diagram showing an example of the conventional microwave band frequency conversion circuit.

Referring to FIG. 1, an embodiment of the frequency conversion circuit according to the present invention will be described hereunder. In FIG. 1, circuit components corresponding to those in FIG. 2 are correspondingly referenced and repeated explanation is omitted.

Figure 3:
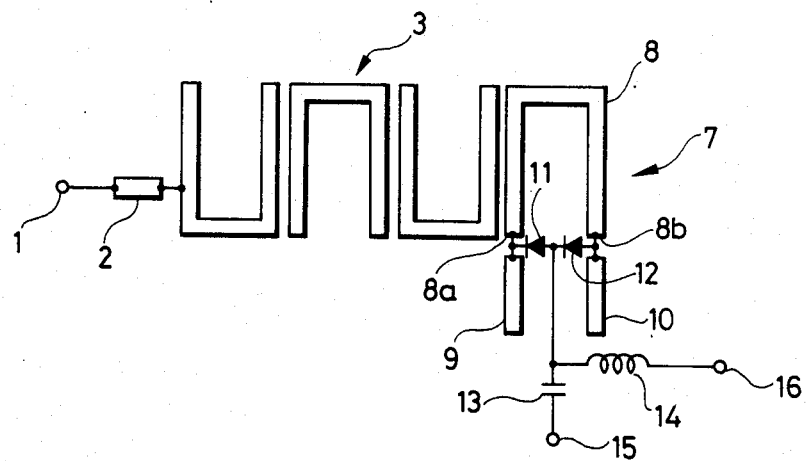
FIG. 3 is a circuit diagram showing another example of the conventional frequency conversion circuit in which miniaturization thereof is intended.

The frequency conversion circuit shown in FIG. 1 is the same as that shown in FIG. 3 only in that a band pass filter 3 and a balanced frequency converter 7 are connected with each other through inductive coupling, but the former is different from the latter in that the band pass filter 3 and the balanced frequency converter 7 are arranged such that one of a pair of strip lines 9 and 10 connected to the opposite sides of the U-shaped line 8 of the frequency converter, that is the line 9 having a ¼ wavelength relative to that of a local oscillation signal, is disposed adjacently in parallel to one of opposite sides of a u-shaped line of the band pass filter 3 so as to provide inductive coupling between te balanced frequency converter 7 and the band pass filter 3.

In the thus arranged circuit, nothing is connected to an open end of the line 9 ( a lower end of the line 9 in FIG. 1 ) and the impedance of the balanced frequency converter 7 becomes the highest at this open end. Here, the induced voltage distribution induced by an electromagnetic wave has the maximum value at this open end portion. Accordingly, the induced voltage induced by an electromagnetic wave radiated from the band pass filter 3 becomes maximum at the open end of the line 9. However, there is provided no load for the induced voltage at the open end to make the inductive coupling strong to thereby obtain a sufficiently large induced voltage for an input signal to the balanced frequency converter 7.

Accordingly, the thus obtained sufficiently large input signal is mixed with an externally supplied local oscillation signal through an local oscillation signal input terminal 15 to thereby produce a sufficiently large intermediate-frequency signal from an intermediate-frequency signal output terminal 16. Moreover, a smaller space may be sufficient for providing the frequency conversion circuit. Further, since no coupling capacitor is not required between the band pass filter and the frequency converter, the circuit can be simplified in configuration and produced with a cost reduced correspondingly.

What is claimed is:

1. A frequency conversion circuit for converting an input signal into an intermediate-frequency signal comprising:
    a first input terminal for receiving an externally applied input signal;
    a band pass filter connected at its one end to said first input terminal;
    a second input terminal for receiving an externally applied local oscillation signal;
    an output terminal for externally sending out an intermediate-frequency output signal;
    said band pass filter including at least a first one U-shaped line of a wavelength substantially one-half of a wavelength of said input signal;
    a frequency converter including a second U-shaped line of a wavelength substantially one-half of the wavelength of said input signal and with its opposite sides disposed substantially parallelly with opposite sides of said first U-shaped line, a pair of strip lines connected to and aligned with said opposite sides of said second U-shaped line respectively, each strip line being of a wavelength substantially one-quarter of a wavelength of the local oscillation signal, a pair of diodes connected in series with each other between the respective ends of the opposite sides of said second U-shaped line;
    said second input terminal and said output terminal being coupled to a junction point between said pair of diodes;
    said band pass filter being coupled at its other end with said frequency converter through an inductive coupling means formed at a position at which the highest impedance appears in said strip lines; said inductive coupling means is formed such that one of said opposite sides of said first U-shaped line is disposed adjacently in parallel to one of said pair of strip lines so that said band pass filter is coupled with said frequency converter at said highest impedance position.

2. A frequency conversion circuit according to claim 1 in which said second input terminal and said output terminal are connected to said junction point through a capacitive means and an inductive means respectively.

* * * * *